US005468162A

United States Patent [19]

Oda

[11] Patent Number: 5,468,162

[45] Date of Patent: Nov. 21, 1995

[54] LOCKING CONNECTOR

[75] Inventor: Kenzo Oda, Hadano, Japan

[73] Assignee: The Whitaker Corporation, Wilmington, Del.

[21] Appl. No.: 378,853

[22] Filed: Jan. 25, 1995

[30] Foreign Application Priority Data

Feb. 9, 1994 [JP] Japan .................................... 6-036552

[51] Int. Cl.[6] .................................... H03R 13/436

[52] U.S. Cl. .................................... 439/752

[58] Field of Search .................................... 439/595, 752

[56] References Cited

U.S. PATENT DOCUMENTS 5,203,722 4/1993 Kinoshita .................................... 439/595

FOREIGN PATENT DOCUMENTS 63-202078 12/1988 Japan .
64-2367 1/1989 Japan .
1-60474 4/1989 Japan .
1-64872 4/1989 Japan .

*Primary Examiner*—Gary Paumen
*Attorney, Agent, or Firm*—Adrian J. LaRue; Robert W. Pitts

[57] ABSTRACT

To offer a locking connector having a double-lock device with a positioner determining the position of the contacts. Cavities 8 are formed in the housing 2. A double-lock device 50 having cavities 64 corresponding to the cavities 8 is inserted in a recess 14 in the housing 2. At the pressure section 54 of the double-lock device 50, an extension 56 is made. From the front end of the extension 56, a connector positioner 58 extends vertically downward along the joining surface 4. The positioner 58 has an opening 60 and front edge 62 which determine position of the contacting sections 102 of the contacts 100 when the double-lock device 50 is in the fully locked position.

10 Claims, 2 Drawing Sheets

LOCKING CONNECTOR

FIELD OF THE INVENTION

This invention is related to connectors, especially to locking-type connectors having a locking device inserted in the housing where it engages and retains the contacts in place.

BACKGROUND OF THE INVENTION

DESCRIPTION OF THE PRIOR ART

The contacts are inserted in the housing cavities where they are retained by lances which are an integral part of the housing. In this case, the locking device usually engages the contacts which are inserted from a side surface of the housing in order to increase the retaining strength. For example, a so-called double-lock connector is described in disclosures of Japanese Utility Model Publication No. 1989-60474 and U.S. Pat. No. 5,203,722. Although the contacts are inserted in the cavities, they are not retained tightly because there are gaps between the contacts and the cavity walls. The same is true for locking connectors. This wobble of the contacts can result in deformation of contacts during connection with a matching connector resulting in reduced reliability of electrical connections. Contacts of male connectors are more susceptible to this kind of deficiencies than female connectors.

Methods of solving this problem include, for example, insertion into the joining cavity of the connector of a piece determining the positioning of the ends of the male contacts where it is retained by friction, like in the disclosure of Japanese Utility Model Publication No. 1989-64872. However, this solution involves an extra part. Another solution involves protrusions made inside the housing cavities which are supposed to support the front ends of the contacts, but this can complicate assembly operations, because the contact ends often became stuck in the gap between the wall and the cavity.

SUMMARY OF THE INVENTION

The purpose of this invention is to offer a locking connector free of the above mentioned problems and ensuring precise positioning of the contacts without additional parts.

Another purpose of this invention is to offer a locking connector providing for a convenient insertion of contacts.

The locking connector according to this invention consists of a housing and a locking device which is engaged with the contacts retained in the housing and whose main body is inserted through a the side wall of the housing wherein the main body of the locking device has an extension emerging from the surface of the pressure section in the direction of the joining plane and a contact positioning part extending from the extension along the joining plane which comes close to the front ends of the contacts or in contact with them when the locking device is completely inserted in the housing, thus preventing the contacts from displacement.

BRIEF DESCRIPTION OF THE DRAWINGS

An embodiment of the invention will now be described by way of example with reference to the accompanying drawings in which.

DETAILED DESCRIPTION OF THE PREFERRED EMBODIMENT

Figure 1:
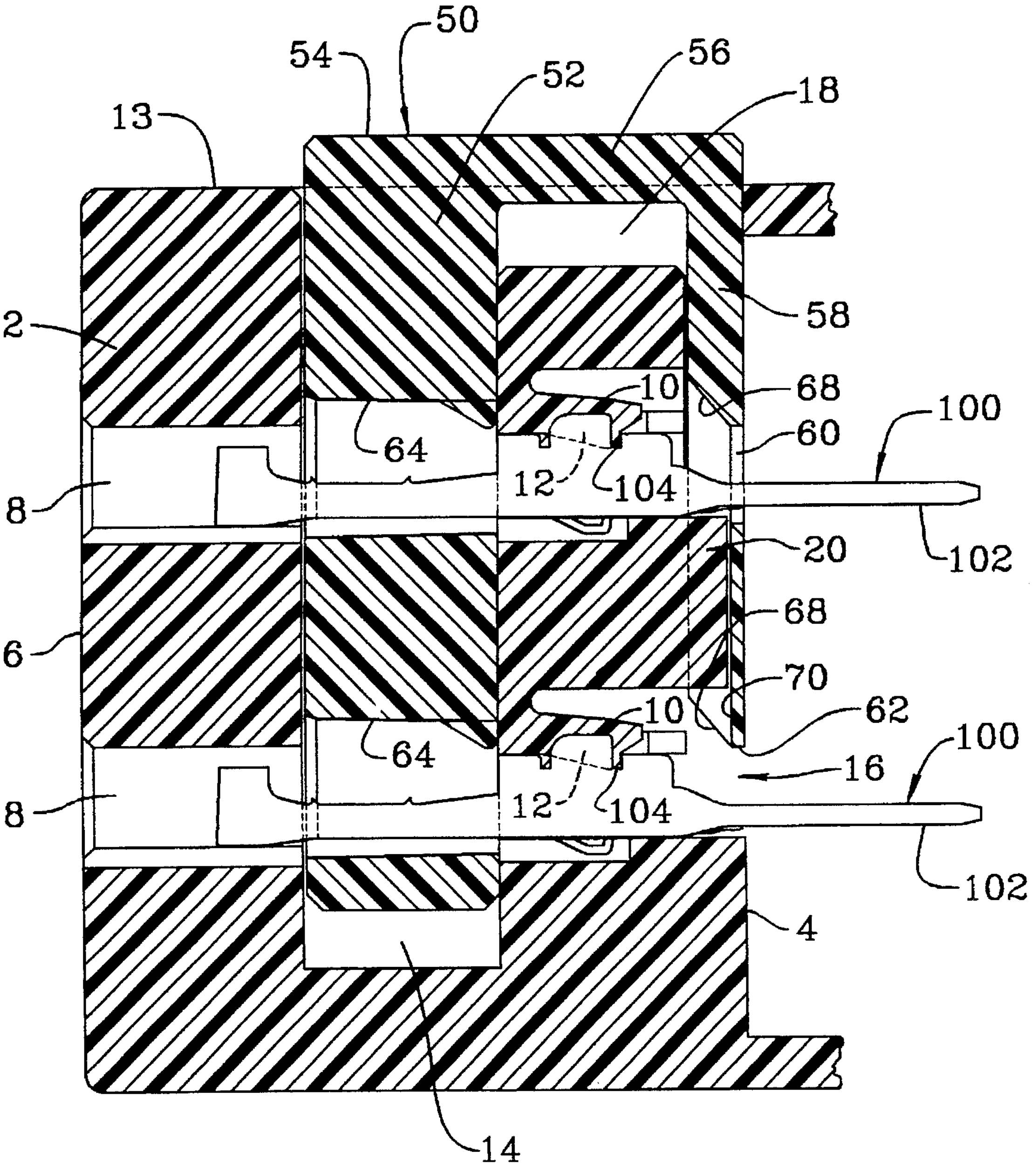
FIG. 1 is a cross section of an embodiment of the locking connector according to this invention with the double-lock device in the temporary locked position.

FIG. 1 is a longitudinal cross section of a connector 1 according to this invention wherein 2 denotes the housing, 50 denotes the double-lock device and 100 denotes contacts. The housing 2 is of rectangular shape and it is made of an insulating material, for example, a plastic. In the housing 2, cavities 8 extend from the side of the joining plane 4 to the back surface. Contacts 100 are inserted in these cavities 8 in two rows so that their contacting sections 102 extend from the joining plane surface 4. The housing 2 has housing lances 10 whose lugs 12 engage the retaining shoulders 104 of the contacts 100 preventing the contacts 100 from being pulled out in a backwards direction. In the housing 2, a slot 14 is provided which starts at a side wall 13 in the direction perpendicular to the joining direction. The slot 14 has sufficient depth to cross the cavities 8.

Double-lock device 50 has a main body 52 which is inserted in the slot 14 and a pressure section 54 which is pushed during insertion. A flat extension 56 extends from the pressure section 54 to the joining surface 4. A contact positioner 58 in the form of a flat plate extends vertically down from the end of the extension 56 along the joining surface 4. The contact positioner 58 has an opening 60, and its front end 62 forms with the housing 2 a gap 16 for the contact 100. In the double-lock device 50, cavities 64 are formed which correspond to the cavities 8. In FIG. 1, the double-lock device 50 is shown in a temporary locked position. In this position, the contacts 100 can be easily inserted from the back surface 6 into the housing 2 where they are retained by engagement between the housing lances 10 and retaining shoulders 104. In order to make insertion of the contacts 100 in the opening 60 and the gap 16 smoother, the opening 60 and the front end 62 have tapered surfaces 68 at their back side. Width of the opening 60 in the direction perpendicular to the plane of the drawing is slightly larger than the width of the contacting section 102 of the contacts 100 so that the contacting section 102 is either in very close or in contact with the edges of the opening in order to prevent the contact from wobbling.

In the housing 2, a recess 18 accommodating the extension 56 is formed. In the end 20 of the joining surface 4, between upper and lower cavities 8, a guiding groove 70 is provided for the contact positioner 58 to provide for a smooth insertion of the positioner 58.

Figure 2:
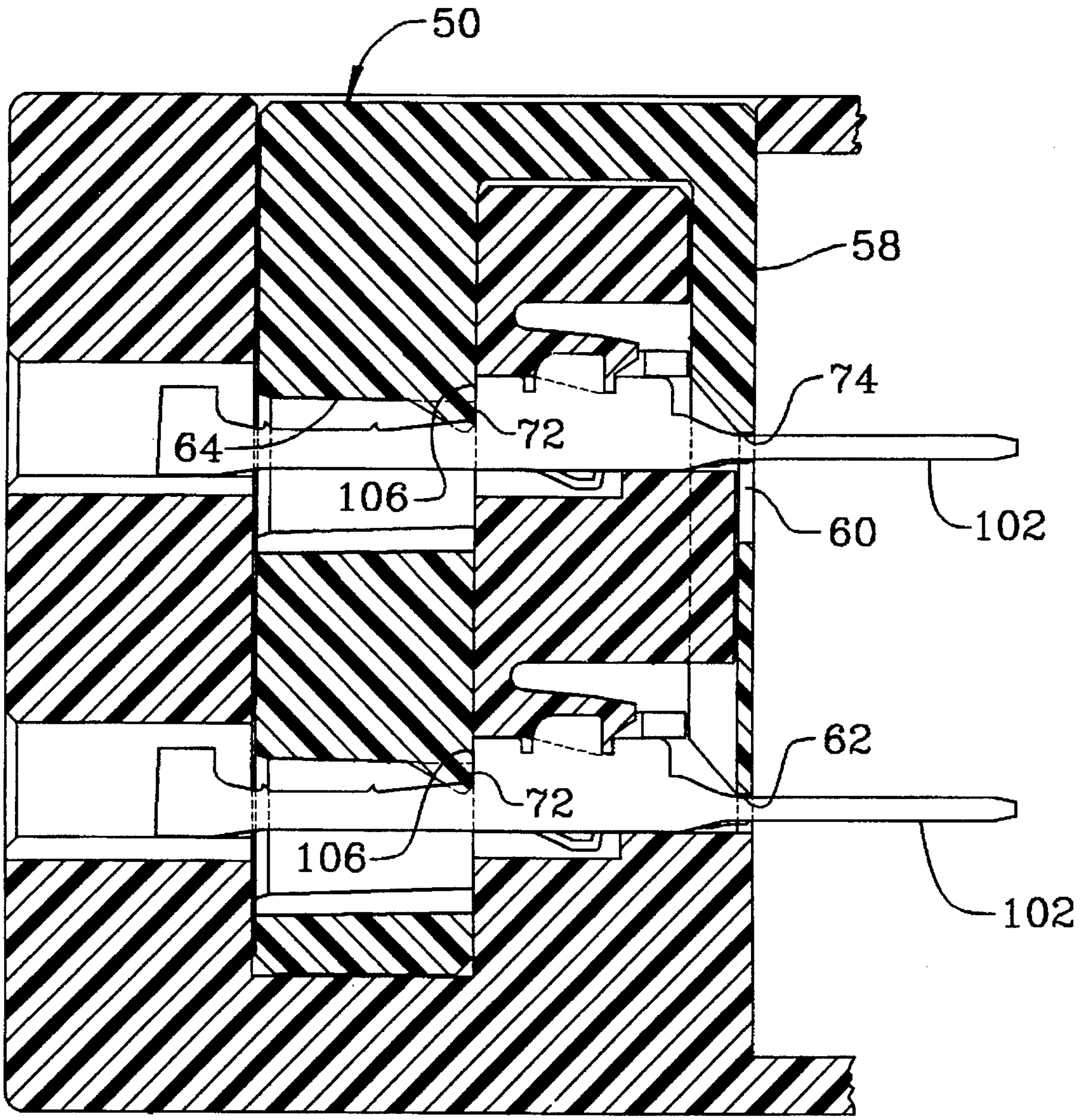
FIG. 2 is a cross section of the locking connector shown in the FIG. 1 with the double-lock device in the fully locked position.

FIG. 2 represents a longitudinal cross section of the connector 1 with the double-lock device 50 in the fully locked position. In this position, lugs 72 in the front of cavities 64 of the double-lock device 50 are engaged with the retaining shoulders 106 of the contacts 100, thus adding retaining strength to the contacts 100. The upper edge 74 of the opening 60 is either in contact with or very close to the contacting section 102, thus limiting wobbling of the contacting section 102 and retaining it in the correct position. Even if the contacting section is slightly bent, it will straighten it. The front end 62 of the positioner 58 provides similar action. The bottom part of the front end 62 has protrusions limiting deviations of the contacting sections in the direction of their width.

The explanations given above are related to the preferred embodiment, however, the invention covers various modifications as well. For example, the contact positioner 58 is made in the form of a flat plate, but it may be made also in the form of a comb. The connector housing may be made without lances.

The locking connector according to this invention has a locking device with an extension to the joining surface and a positioner extending down along the joining surface which prevents the deviation of the contacts when it is in the fully locked position, thus offering the following advantages.

Insertion of the locking device results in an increase in the strength retaining the contacts and in retaining the contacting sections of the contacts in a proper position which makes it possible to avoid improper connections with the contacts of the matching connector or the bending of the contacts during the joining of the connectors. As the result, the reliability of electric connections is greatly increased.

I claim:

1. A locking electrical connector comprising a housing, at least one contact, each contact having a front end matable with other contacts at a joining surface on said connector, and a locking device whose main body is inserted through a side wall of said housing in a direction substantially normal to the side wall, the locking device being engaged with each contact retained in said housing, characterized by the fact that:

said main body of said locking device has an extension emerging from the surface of a pressure section thereof in a direction towards said joining surface, and a contact positioning part extending from said extension along the joining surface which comes close to front ends of said contacts or in contact with said contacts when said locking device is completely inserted in the housing, thus preventing displacement of said front ends of said contacts.

2. The locking electrical connector of claim 1 wherein said contact positioning part, when fully inserted into said housing is positioned adjacent said front end of each of said contacts to substantially prevent movement of said front ends in the plane of said joining surface.

3. The locking electrical connector of claim 1 wherein said locking device includes lugs engagable with a rear retaining shoulder on each of said contacts upon insertion of said locking device into said housing, engagement of said lugs with said retaining shoulders preventing removal of said contacts through a rear face of said connector, said rear face being on the opposite side of said connector from said joining surface.

4. The locking electrical connector of claim 3 wherein said pressure section and said lugs are on the main body of said locking device, said contact positioning part extending from said extension parallel to said main body of said locking device, and spaced from said main body.

5. The locking electrical connector of claim 4 wherein said housing includes a slot extending from said side wall, said main body being received in said slot, said contact positioning part being located along the joining surface.

6. The locking electrical connector of claim 5 wherein each of said contacts is located in a housing cavity, each housing cavity intersecting said slot, said contact positioning part substantially closing an end of each of said housing cavities on the joining surface of said connector when said main body is inserted into said slot.

7. The locking electrical connector of claim 1 wherein said contact positioning part includes openings, said front end of each of said contacts being insertable through a respective opening when said locking device is in a first position, each said opening having an edge movable toward said front end of a respective one of said contacts when said main body of said locking device is inserted from said first position into said housing.

8. The locking electrical connector of claim 7 wherein multiple rows of said contacts are located in said housing, a front end of said contact positioning part, spaced from said openings being shiftable into substantial engagement with contacts in one row when said edges of said openings are shifted into substantial engagement with the contacts in another row.

9. The locking electrical connector of claim 1 wherein a contact engagement lug is located on said main body, said housing including a housing lance engaging each said contact between said main body and said contact positioning part.

10. The locking electrical connector of claim 9 wherein said housing lance engages said contact independent of the position of the contact positioning part.

* * * * *